(12) United States Patent
Carrozza et al.

(10) Patent No.: US 6,603,349 B2
(45) Date of Patent: Aug. 5, 2003

(54) DOPPLER LEARNING PHASE LOCK LOOP FOR BURST DEMODULATOR

(75) Inventors: Dominic P. Carrozza, Redondo Beach, CA (US); David A. Wright, Hermosa Beach, CA (US); Reginald Jue, Manhattan Beach, CA (US)

(73) Assignee: TRW Inc., Redondo Beach, CA (US)

( * ) Notice: Subject to any disclaimer, the term of this patent is extended or adjusted under 35 U.S.C. 154(b) by 72 days.

(21) Appl. No.: 09/910,162

(22) Filed: Jul. 20, 2001

(65) Prior Publication Data

US 2003/0016079 A1 Jan. 23, 2003

(51) Int. Cl.[7] .................................................. H03D 3/00
(52) U.S. Cl. ........................ 329/304; 375/340; 375/327
(58) Field of Search ................................. 329/307, 304; 375/329, 340, 346, 376, 324, 327

(56) References Cited

U.S. PATENT DOCUMENTS 5,696,797 A * 12/1997 Bucher et al. .............. 329/307
6,424,185 B1 * 7/2002 Wolf ........................... 327/105

* cited by examiner

Primary Examiner—Benny Lee
Assistant Examiner—Kimberly Glenn
(74) Attorney, Agent, or Firm—Antonelli, Terry, Stout & Kraus, LLP

(57) ABSTRACT

The present invention is a demodulator and a method of demodulating burst communications. A demodulator (100, 200) includes a phase angle source (18), coupled to a current received burst communication, which provides a phase angle of the current received burst communication; a comparator (20), coupled to the phase angle source and a source of an estimated phase angle, which provides an output signal representing an angular difference between a phase of the current received burst communication and the estimated phase angle; and a phase lock loop (20), coupled to the output signal, which provides the estimated phase angle. The phase lock loop includes a Doppler accumulator (102) which provides a Doppler output which provides compensation in the estimated phase angle for the Doppler effect produced by relative motion between the demodulator and a source of the burst communications.

52 Claims, 3 Drawing Sheets

DOPPLER LEARNING PHASE LOCK LOOP FOR BURST DEMODULATOR

BACKGROUND OF THE INVENTION

1. Field of the Invention

The present invention relates to demodulators which demodulate burst communications and more specifically, to phase lock loops (PLL) which track the phase signal which is being demodulated.

2. Description of the Prior Art

In communication systems, particularly digital communication systems comprising a transmitter for digital data transmissions and a receiver for reception thereof, it is customary to modulate a carrier with any one of many different modulation techniques, including phase shift keying (PSK). Specific examples include binary phase shift keying (BPSK) modulation or quaternary phase shift keying (QPSK) modulation. When information is modulated onto a carrier, the receiver generally differs in timing from the transmitter due to a frequency difference between the local oscillators at the transmitter and receiver and the effect of varying delays and frequency shifts in the propagation path therebetween.

To track and coherently demodulate PSK modulated signals received from a transmitter, it is necessary for the receiver to form an estimate of the transmitter's phase so that the tumbling received signals may be transformed back into the fixed phase space of the transmitter. This process is known as "phase tracking." Conventionally, there are a number of phase tracking loops employing phase locking principles, such as squaring loops, Costas tracking loops, and digital decision-directed feedback loops for performing phase tracking of either a BPSK or QPSK modulated signal. A commonly used method for performing this type of phase tracking is the digital decision directed phase locked loop (DD-PLL). The basic principle of DD-PLLs is well known as described in the classic "*Telecommunication Systems Engineering*" text by William C. Lindsey and Marvin K. Simon, originally published by Prentice-Hall in 1973, and the "*Digital Communications*" text by Kamilo Fehere, originally published by Prentice-Hall in 1983 and republished by Noble Publishing Corp. in 1997. The input to a DD-PLL is typically a sequence of complex data sample pairs obtained by down converting the incoming BPSK or QPSK modulated signal to a baseband quadrature (orthogonal) pair in a form of an I,Q digit combination which is passed through matched filters with sampling of the results occurring at the symbol rate. This sampled pair is considered a complex variable in rectangular form. The complex variable is converted to polar form to produce the equivalent polar variable pair. The apparent incoming phase is referenced to the currently estimated phase (i.e. the tracked phase) to form a phase difference. The phase difference between the incoming phase and the estimated phase is influenced by the true difference between the phase systems of the transmitter and the receiver, by phase and thermal noise present at the receiver, and by a symbol's data content which changes in angle by a multiple of $\pi/2$ for QPSK or of $\pi$ for BPSK. The polar form is then transformed back into the rectangular form, for subsequent processing, including soft decision decoding when error control is being utilized.

In contemporary phase tracking circuits, the effect of the data content on the phase difference between the incoming phase and the estimated phase is compensated by making a "hard" decision on the data content of each individual BPSK or QPSK symbol on the rectangular coordinates. A standard phase detector generates phase error measurements for each BPSK or QPSK symbol, based on the hard decision of each symbol. In the absence of noise in the baseband quadrature pair, the estimated phase decision, which is based on each individual BPSK or QPSK symbol, is usually correct so that the resultant phase error measurement equals the true difference between the phase systems of the transmitter and the receiver. The value of the resultant phase error measurement is then filtered to yield an updated estimate for use at the next symbol epoch in a classical servo loop.

In practice, noise is always present so that the resultant phase error measurement may be grossly distorted, especially when an incorrect decision is made in converting the phase difference between the incoming phase and the estimated phase to the resultant phase error measurement. As long as the error rate is small, symbol-by-symbol DD-PLLs perform well. However, at low signal-to-noise ratios, the Bit Error Rate (BER) can be relatively high which means that the phase detector can also be unreliable. The effect of incorrect decisions, together with the large amount of noise entering the loop, causes the tracking loop performance to degrade. The deviation of the tracked phase variable increases faster than the signal to noise ratio degrades.

A common architectural structure in a data communication systems to which the present invention is applicable is for a central point to communicate with many individual user terminals (UTs). Examples include:

1. Current VSAT (very small aperture terminals) networks where the hub (i.e., the single point) communicates with many individual terminals, via a conventional (i.e., bent pipe) satellite.
2. Digital cellular radio systems where a base station (the single point) communicates with many users—who may be mobile. GSM and IS-54 are specific cases in point.
3. Processing satellite (PS) systems which are similar in principle to VSATs but where the central point is located in space, typically in a geosynchronous satellite system.

As the list above reveals, there are many types of prior art systems to which the subject invention has application. For specificity, the case of a processing satellite is hereinafter used, but it should be understood that the description of the prior art in the context of a satellite is not to be construed as a limitation of the invention to satellite applications. In a satellite application, the forward and reverse links are called the downlink and uplink, respectively, and these terms may be used interchangeably.

Systems with this basic architecture frequently use a Time Division Multiplex: Frequency Division Multiple Access/Time Division Multiple Access (TDM: FDMA/TDMA) architecture. That is, the downlink (PS to UT) uses a high speed single carrier with time division multiplexing to share its downlink capacity among the many user terminals: the uplinks (user UT to PS) typically include many frequency divided low/medium speed carriers ("FDMA") which in turn are further shared in time using well known TDMA techniques. The TDM downlink is a continuous flow: the uplinks are bursty.

In systems with the foregoing structure, it is common practice for the UTs to reference the frequency they use in the uplink to that observed in the downlink, typically by extracting the down link symbol rate for use as a local frequency standard. By so doing, the frequencies received by the PS in the uplinks are derived from the frequency transmitted by the PS on the downlink. Among other advantages, this technique may reduce the cost of the UTs by eliminating the need for each UT to have a stable, autonomous, frequency source.

As is well known in the field of digital communications, recovery of TDMA bursts is easier and more reliable when the frequency of the arriving burst is close to that of the demodulator. Thus, the technique of locking the reverse frequency to the forward frequency has these performance advantages as well as the UT cost benefit previously mentioned.

When there is relative motion present between the PS and the UT, frequencies seen by the UT are shifted by the well-known Doppler effect. That is, if the satellite uses frequency $f_{PS,d}$ in its downlink, then the UT sees the frequency $f_{UT,d}=f_{PS,d}*(1+v/c)$ where "v" is the relative (radial component) velocity and is positive when the satellite is moving away from the terminal, and "c" is the speed of light. For typical modern practice in a PS system, the relative motion is quite small, being of the order of one meter per second, so that the apparent frequency shift is of the order of a few parts per billion. In the case of a PS, the motion follows a diurnal pattern similar to that of tide heights and changes over the course of a (sidereal) day. Such change is very gradual, however.

When Doppler shift is present, the frequency used as a reference by the UTs is not the same as that sent fro the satellite, so that the UT's uplink frequency is shifted by the factor (1+v/c). Moreover, since Doppler shift affects the uplink as well as the downlink, the frequency seen by the PS is further shifted by the same factor so that the PS sees a frequency that is shifted by $(1+v/c)^2$ or approximately (1+2*v/c).

Another aspect of the problem caused by Doppler shift arises when the coverage area of the PS extends over much of the earth, since there is parallax between the lines of sight of widely separated UTs. As a result, the radial component of motion (which is proportional to the cosine of the angle between the line of sight and the velocity vector) may differ for two widely separated UTs. This situation arises especially in a multi-beam PS system where some beams may be widely separated.

One approach to mitigating the effect of Doppler shift in these systems is to provide information about current Doppler (or, equivalently, current radial velocity) to the satellite. When current Doppler shift is known, the satellite can correct its receiver's frequency by a double Doppler factor so that the uplink frequency of a UT will match that at the PS. This approach has some disadvantages, however:

1. The kinematics of the satellite must be ascertained externally.
2. A message must be periodically sent to the satellite to apprise it of its motion.
3. A frequency compensating apparatus must be provided to shift the PS's receiver's frequency in accordance with the motion information.
4. Multiple messages may be required for different, widely separated, beams.
5. The correction is only as accurate as the estimate of radial velocity.

FIG. 1 illustrates a block diagram of a prior art burst demodulator contained in a communication receiver 10. The communication receiver 10 includes a downconverter 12 for down converting an incoming BPSK or QPSK signal 12 from radio frequency (RF) to an intermediate frequency (IF). A complex mixer 14, then downconverts the IF signal to complex baseband, outputting a sequence of complex pairs P(n), Q(n) which are applied to matched filters 16. The matched filter 16 outputs the sequence of complex sample pairs P'(n), Q'(n) and samples the results at the Jth symbol epoch. The output from the matched filters 16 may be considered a complex variable in rectangular form. A rectangular to polar converter 18 receives the sample output of the matched filters 16 and converts the sample output into a polar form to produce an equivalent variable pair with a radius $r_n$ and phase angle $\alpha_n$. The output phase $\alpha_n$ is a phase angle of the current received burst communication which feeds into the phase lock loop 22, which is comprised of a phase comparator 20, a phase error function 24, and a loop filter 2b. Comparator 20 produces an output signal $\Psi_n$ representing an angular difference between a phase of the current received burst communication $\alpha_n$ and an estimated phase angle $\theta_n$. The phase error function 24 converts the phase error $\Psi_n$ into a voltage which is applied to loop filter 24. The output of the loop filter 24 is the estimated phase angle $\theta_n$. The loop filter 24 may provide first order compensation produced from a phase accumulator or first and second order compensation produced by a phase accumulator and a frequency burst accumulator whose output is an input to the phase accumulator. The loop filter 24 receives initial conditions from a burst preamble processor. The phase error function 24 removes the effect of demodulated information in the input modulated signal on phase lock loop 22.

In a conventional burst demodulator, the error $\Psi_n$ is filtered to yield the tracking phase via the loop filter 24, which is typically first order (one accumulator) or second order (two accumulators). The accumulator(s) in the filter are usually preset early in the processing of a burst based on the results from the receivers preamble processor. Typically these results include (a) an indicator of whether a burst is present and (b) initial conditions for the loop filter including, as a minimum, an initial phase $\theta_0$ and (possibly for a second order loop) an initial frequency. The output from the rectangular to polar converter 18 and the difference between the phase of the current burst and the estimated phase angle are applied to a polar to rectangular converter 28 which converts the sampled data back into rectangular form. The output of the polar to rectangular converter 28 is applied to a decoder 30 which produces the demodulated output 32.

The prior art receiver 10 of FIG. 1 is subject to the problems caused by Doppler shift described above.

SUMMARY OF THE INVENTION

The present invention is a receiver and a demodulator which demodulates burst communications and a method of receiving burst communications which eliminates from a phase lock loop of the demodulator the effect of relative motion between the demodulator and the source of the burst communications which produces a Doppler shift or a frequency shift caused by any slowly varying common mode drift in the frequency of the received burst communications. The present invention permits receivers and the demodulators therein to automatically recover and track Doppler motion. In a satellite, the frequency difference caused by Doppler motion is treated separately in each spot beam so that any parallax effect is minimized since the lines of sight for individual user terminals situated within a beam's coverage area are very nearly parallel (since the beam coverage is small).

The invention augments traditional burst type PLLs and DD-PLLs by providing a Doppler frequency or a slowly varying common mode drift signal accumulator in the loop filter. The Doppler or a slowly varying common mode drift signal accumulator is situated between where the PLL or DD-PLLs develops an error voltage representative of the angular difference between the current burst communication and the estimated phase and the PLL's or DD-PLLs final phase accumulator. The loop filter may include a conventional burst frequency accumulator in addition to the Doppler or a slowly varying common mode drift signal accumulator of the present invention, but it should be understood that the presence of a frequency burst accumulator is not required for the practice of the invention.

The Doppler or a slowly varying common mode drift signal accumulator of the present invention has two features of importance. First, the gain applied to the error signal, which is inputted to the Doppler or a slowly varying common mode drift signal accumulator, is much smaller than the gain which is applied to the error signal which is inputted to the optional frequency burst accumulator or the phase accumulator. This relative small gain provides the Doppler or a slowly varying common mode drift signal accumulator with minimal response to noise and to burst frequency variations resulting from imprecision in the downlink frequency. The gain used in the Doppler or a slowly varying common mode drift signal accumulator is typically much smaller than that used for the burst frequency accumulator of the second order PLL or DD-PLL. Furthermore, the Doppler or a slowly varying common mode drift signal accumulator is not reset between bursts which does occur in the frequency burst accumulator of a prior art PLL or DD-PLL. To prevent the Doppler or a slowly varying common mode drift signal accumulator from responding to a situation when only noise is present at the receiver, gating may be added causing the Doppler or a slowly varying common mode drift signal accumulator to be clamped to its previous value when the receiver is operating only on noise.

A Doppler or a slowly varying common mode drift signal telemetry point may be added to the Doppler or a slowly varying common mode drift signal accumulator for the purpose of providing an accurate estimate of the relative Doppler or a slowly varying common mode drift signal shift which has occurred. The accurate estimate may be used as part of an algorithm for determining satellite ephemeris and may be used as a locally generated compensation to refine an initial phase estimate for each burst generated by the burst preamble processor in setting the initial conditions of the frequency burst accumulator. Improving the initial phase estimate significantly increases a probability that the PLL will successfully acquire and track an incoming burst phase and frequency. Additionally, a register may be added to the Doppler or a slowly varying common mode drift signal accumulator which permits ground control software to either bias the Doppler or a slowly varying common mode drift signal accumulator within a priori knowledge of a Doppler or a slowly varying common mode drift signal slew rate greater than the loop tracking rate or to substitute the known Doppler or a slowly varying common mode drift signal rate for the locally generated Doppler or a slowly varying common mode drift signal measurement.

A demodulator which demodulates burst communications in accordance with the invention may include a phase angle source, coupled to a current received burst communication, which provides a phase angle of the current received burst communication; a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle; and wherein the phase lock loop includes a Doppler accumulator which provides a Doppler output which provides compensation in the estimated phase angle for the Doppler effect produced by relative motion between the demodulator and a source of the burst communications. A phase accumulator may provide a first order component of compensation in the estimated phase angle; and the Doppler accumulator may provide a second order component of compensation in the estimated phase angle. A burst frequency accumulator may provide a second order component of compensation in the estimated phase angle. The Doppler accumulator and the burst frequency accumulator may be in parallel; and outputs thereof may be inputted to the phase accumulator. The burst frequency accumulator may be reset in response to each received burst communication. The Doppler accumulator may continuously accumulate Doppler variations caused by the relative motion and may provide compensation in the estimated phase angle which is not reset upon reception of each received burst communication. The Doppler accumulator and the burst accumulator may each be responsive to error signal with a ratio of the gain in the burst accumulator to the gain in the Doppler accumulator being on the order of 1000. The Doppler accumulator may comprise a telemetry output which signals a magnitude of a Doppler shift between the demodulator and the source of burst communications. A burst preamble processor may provide an initial frequency estimate to the burst frequency accumulator; and wherein the Doppler output may be applied to the burst frequency accumulator as part of the initial frequency estimate of the burst frequency accumulator to correct the initial frequency estimate for Doppler shift. A storage register may be contained in the Doppler accumulator which, upon command, applies a known Doppler value as compensation in the estimated phase angle while disabling the Doppler output from providing compensation. The demodulator may be a hub in a communication system, a base station of a digital cellular radio system or in a satellite. A burst preamble processor, which is responsive to a burst input, may produce a gating signal; and a gate, coupled to the comparator and the Doppler accumulator, in response to the gating signal, may pass a signal which is a function of the output signal from the comparator to the Doppler accumulator.

A demodulator which demodulates burst communications in accordance with the invention includes a phase angle source, coupled to a current received burst communication, which provides a phase angle of the current received burst communication; a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle including a phase accumulator which provides a first order component of compensation in the estimated phase angle; and wherein the phase lock loop includes a Doppler accumulator which provides a Doppler output which provides compensation in the estimated phase angle for the Doppler effect produced by relative motion between the demodulator and a source of the burst communications; and the Doppler accumulator provides a second order component of compensation in the estimated phase angle.

A demodulator which demodulates burst communications in accordance with the invention includes a phase angle source, coupled to a current received burst communication, which provides a phase angle of the current received burst communication; a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle including a phase accumulator which provides a first order component of compensation in the estimated phase angle and a burst frequency accumulator which provides a second order component of compensation in the estimated phase angle; and wherein the phase lock loop includes a Doppler accumulator which provides a Doppler output which provides another second order component of component in the estimated phase angle for the Doppler effect produced by relative motion between the demodulator and a source of the burst communications. The Doppler accumulator may continuously accumulate Doppler variations caused by the relative motion and may provide compensation in the estimated phase angle which is not reset upon reception of each received burst communication. The Doppler accumulator and the burst frequency accumulator may be in parallel; and outputs thereof may be inputted to the phase accumulator. The burst frequency accumulator may be reset in response to each received burst communication. The Doppler accumulator may continuously accumulate Doppler variations caused by the relative motion and may provide compensation in the estimated phase angle which is not reset upon reception of each received burst communication. The Doppler accumulator and the burst accumulator may be each responsive to an input signal which is a function of the output signal with a ratio of a magnitude of the input signal to the burst accumulator to a magnitude of the input signal to the Doppler accumulator being at least 10. The phase accumulator may be responsive to an input signal which is a function of the output signal with a ratio of a magnitude of the input signal to the phase accumulator to a magnitude of the input signal to the Doppler accumulator being at least 1000. The Doppler accumulator may comprise a telemetry output which signals a Doppler shift between the demodulator and the source of burst communications. A burst preamble processor may provide an initial frequency estimate to the burst frequency accumulator; and wherein the Doppler output may be applied to the burst frequency accumulator as part of the initial frequency estimate of the burst frequency accumulator to correct the initial frequency estimate for Doppler shift.

In a demodulator which demodulates burst communications including, a comparator coupled to the phase angle source and a source of an estimated phase angle and a phase lock loop, a method of receiving burst communications in accordance with the invention may include providing a phase angle from a phase angle source of a current received burst communication; providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications. The phase lock loop may comprise a phase accumulator which provides a first order component of compensation in the estimated phase angle and the Doppler accumulator may provide a second order component of compensation in the estimated phase angle. A burst frequency accumulator may provide another second order compensation in the estimated phase angle. The Doppler accumulator and the burst frequency accumulator may be in parallel with outputs thereof being inputted into the phase accumulator. The burst frequency accumulator may be reset in response to each received burst communication. The Doppler accumulator may continuously accumulate Doppler variations and provide compensation in the estimated phase angle which is not reset upon reception of each received burst communication. The Doppler accumulator and the burst accumulator may each be responsive to an input signal which is a function of the output signal with a ratio of a magnitude of the input signal to the burst accumulator to a magnitude of the input signal to the Doppler accumulator being at least 10. The phase accumulator may also be responsive to an input signal which is a function of the output signal with a ratio of a magnitude of the input signal to the phase accumulator to a magnitude of the input signal to the Doppler accumulator being at least 1000. The Doppler accumulator may comprise a telemetry output which signals a magnitude of a Doppler shift between the demodulator and the source of burst communications. A burst preamble processor may provide an initial frequency estimate to the burst frequency accumulator; and wherein the Doppler output may be applied to the burst frequency accumulator as part of the initial frequency estimate of the burst frequency accumulator to correct the initial frequency estimate for Doppler shift. A storage register may be contained in the Doppler accumulator which, upon command, applies a known Doppler value as compensation in the estimated phase angle while disabling the Doppler output from providing compensation. A burst preamble processor, may be responsive to a burst input to produce a gating signal and a gate coupled to the comparator and the Doppler accumulator; and wherein the gate, may in response to the gating signal, pass a signal which is a function of the output signal from the comparator to the Doppler accumulator.

In a demodulator which demodulates burst communications including a phase angle source, a comparator coupled to the phase angle source and a source of an estimated phase angle and a phase lock loop, a method of receiving burst communications in accordance with the invention includes providing a phase angle from the phase angle source of a current received burst communication; providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications. The Doppler accumulator may continuously accumulate Doppler variations and provide compensation in the estimated phase angle which is not reset upon reception of each received burst communication. A storage register may be contained in the Doppler accumulator which, upon command, applies a known Doppler value as compensation in the estimated phase angle while disabling the Doppler output from providing compensation.

In a demodulator which demodulates burst communications including a phase angle source, a comparator coupled to the phase angle source and a source of an estimated phase angle and a phase lock loop, a method of receiving burst communications in accordance with the invention includes providing a phase angle from a phase angle source of a current received burst communication; providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications; and the phase lock loop comprises a phase accumulator which provides a first order component of compensation in the estimated phase angle and the Doppler accumulator provides a second order component of compensation in the estimated phase angle. The Doppler accumulator may continuously accumulate Doppler variations and provide compensation in the estimated phase angle which is not reset upon reception of each received burst communication.

In a demodulator which demodulates burst communications including a phase angle source, a comparator coupled to the phase angle source and a source of an estimated phase angle and a phase lock loop, a method of receiving burst communications in accordance with the invention includes providing a phase angle from the phase angle source of a current received burst communication; providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications; wherein the phase lock loop comprises a phase accumulator which provides a first order component of compensation in the estimated phase angle and the Doppler accumulator provides a second order component of compensation in the estimated phase angle; and a burst frequency accumulator provides another second order compensation in the estimated phase angle. The Doppler accumulator and the burst frequency accumulator may be in parallel with outputs thereof being inputted into the phase accumulator. The burst frequency accumulator may be reset in response to each received burst communication. The Doppler accumulator may continuously accumulate Doppler variations and provide compensation in the estimated phase angle which is not reset upon reception of each received burst communication. The Doppler accumulator may comprise a telemetry output which signals a Doppler shift between the demodulator and the source of burst communications. A burst preamble processor may provide an initial frequency estimate to the burst frequency accumulator; and wherein the Doppler output may be applied to the burst frequency accumulator as part of the initial frequency estimate of the burst frequency accumulator to correct the initial frequency estimate for Doppler shift.

A demodulator which demodulates burst communications in accordance with the invention includes a phase angle source, coupled to a current received burst communication, which provides a phase angle of the current received burst communication; a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle; and wherein the phase lock loop includes a slowly varying common mode drift signal accumulator which provides a slowly varying common mode drift signal output which provides compensation in the estimated phase angle for an effect of the slowly varying common mode drift signal.

A demodulator which demodulates burst communications in accordance with the invention includes a phase angle source, coupled to a current received burst communication, which provides a phase angle of the current received burst communication; a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle including a phase accumulator which provides a first order component of compensation in the estimated phase angle; and wherein the phase lock loop includes a slowly varying common mode drift signal accumulator which provides a slowly varying common mode drift signal output which provides compensation in the estimated phase angle for an effect of the slowly varying common mode drift signal; and the slowly varying common mode drift signal accumulator provides a second order component of compensation in the estimated phase angle.

A demodulator which demodulates burst communications in accordance with the invention includes a phase angle source, coupled to a current received burst communication, which provides a phase angle of the current received burst communication; a comparator, coupled to the phase angle source and a source of an estimated phase angle, including a phase accumulator which provides a first order component of compensation in the estimated phase angle; and a phase lock loop, coupled to the output signal, which provides the estimated phase angle including a phase accumulator which provides a first order component of compensation in the estimated phase angle and a burst frequency accumulator which provides a second order component of compensation in the estimated phase angle; and wherein the phase lock loop includes a slowly varying common mode drift signal accumulator which provides a slowly varying common mode drift signal output which provides another second order compensation of compensation in the estimated phase angle for an effect of the slowly varying common mode drift signal.

In a demodulator which demodulates burst communications including a phase angle source, a comparator coupled to the phase angle source and a source of an estimated phase angle and a phase lock loop, a method of receiving burst communications includes providing a phase angle from the phase angle source of a current received burst communication; providing from the comparator an output signal representing an angular difference between a phase of the current received burst communication and the estimated phase angle; and providing the estimated phase angle from the phase lock loop including a slowly varying common mode drift signal output which provides compensation in the estimated phase angle for an effect of the slowly varying common mode drift signal.

In a demodulator which demodulates burst communications including a phase angle source, a comparator coupled to the phase angle source and a source of an estimated phase angle and a phase lock loop, a method of receiving burst communications includes providing a phase angle from a phase angle source of a current received burst communication; providing from the comparator an output signal representing an angular difference between a phase of the current received burst communication and the estimated phase angle; and providing the estimated phase angle from the phase lock loop including a slowly varying common mode drift signal output which provides compensation in the estimated phase angle for an effect of the slowly varying common mode drift signal; and the phase lock loop comprises a phase accumulator which provides a first order component of compensation in the estimated phase angle and a slowly varying common mode drift signal accumulator provides a second order component of compensation in the estimated phase angle.

In a demodulator which demodulates burst communications including a phase angle source, a comparator coupled to the phase angle source and a source of an estimated phase angle and a phase lock loop, a method of receiving burst communications includes providing a phase angle from the phase angle source of a current received burst communication; providing from the comparator an output signal representing an angular difference between a phase of the current received burst communication and the estimated phase angle; and providing the estimated phase angle from the phase lock loop including a slowly varying common mode drift signal output which provides compensation in the estimated phase angle for an effect of the slowly varying common mode drift signal; wherein the phase lock loop comprises a phase accumulator which provides a first order component of compensation in the estimated phase angle and a slowly varying common mode drift signal accumulator provides a second order component of compensation in the estimated phase angle; and a burst frequency accumulator provides another second order compensation in the estimated phase angle.

BRIEF DESCRIPTION OF THE DRAWINGS

Like reference numerals identify like parts throughout the drawings.

DETAILED DESCRIPTION OF THE INVENTION

Figure 1:
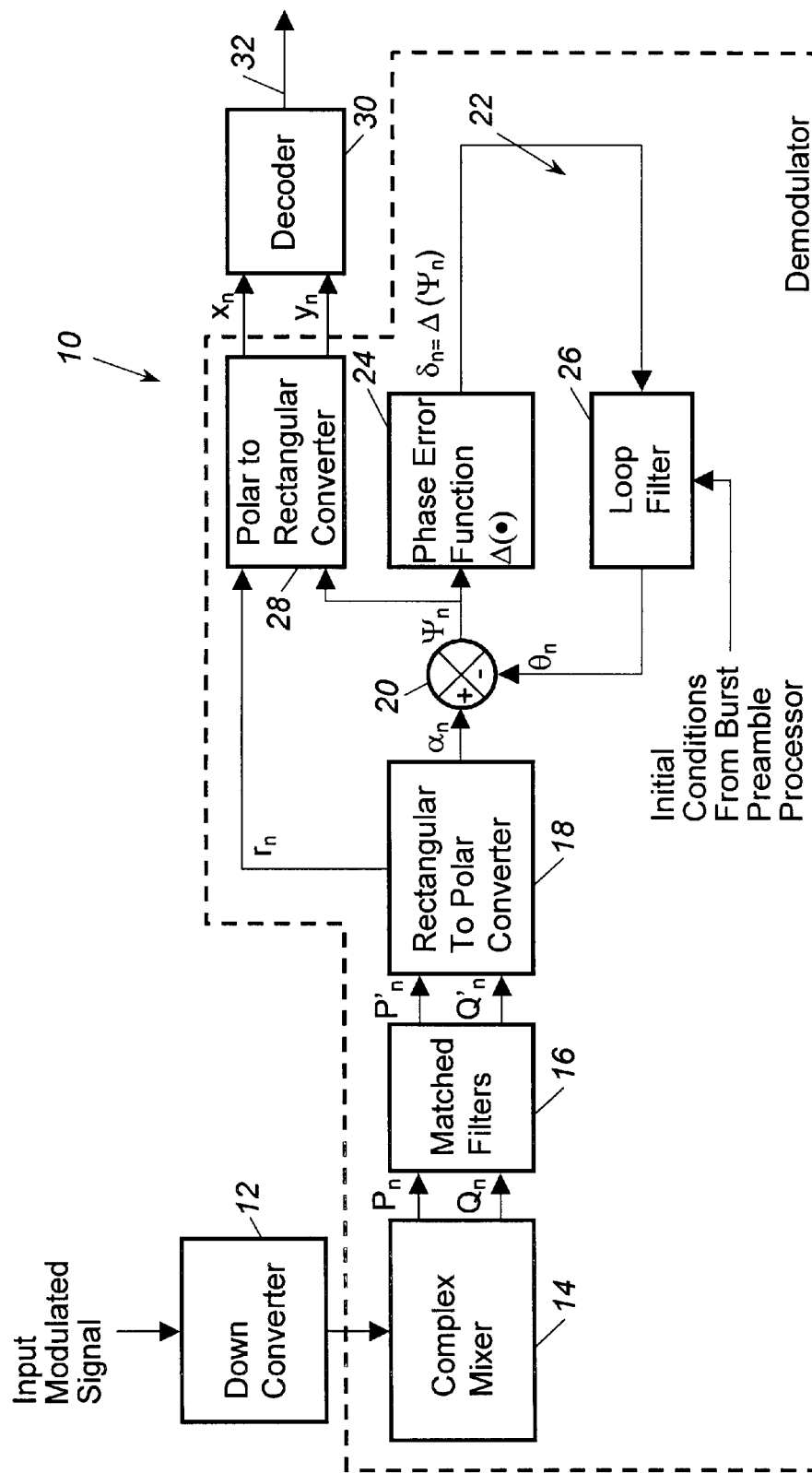
FIG. 1 illustrates a block diagram of a prior art receiver for receiving burst communications.
Figure 2:
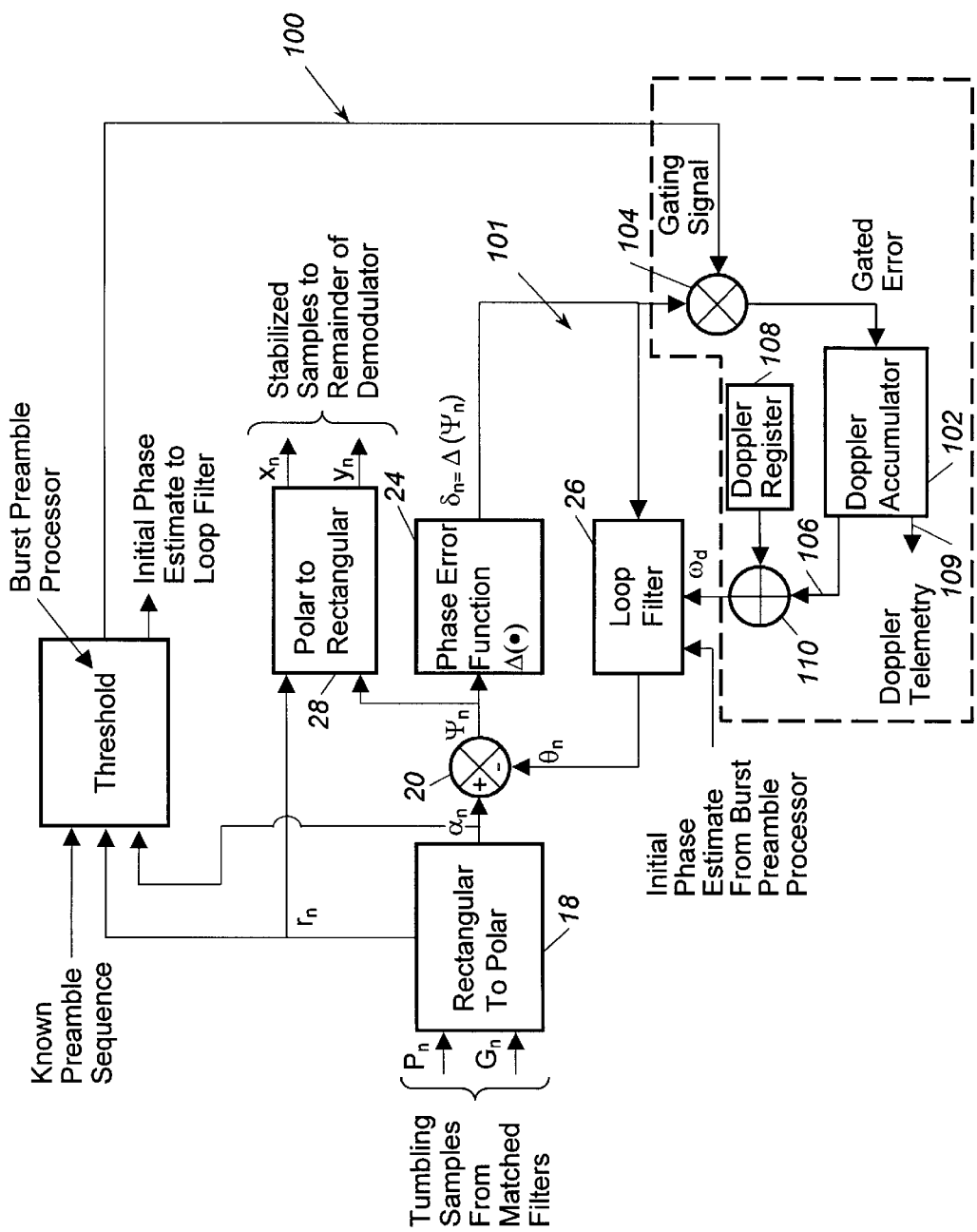
FIG. 2 illustrates a conceptual block diagram of the present invention.

FIG. 2 illustrates a conceptual embodiment 100 of a demodulator in accordance with the present invention. The embodiment 100 differs from the prior art of FIG. 1 by adding a Doppler or a slowly varying common mode drift signal accumulator 102 to the loop filter 26 to provide Doppler or a slowly varying common mode drift signal shift compensation thereto. The loop filter 26 may provide either first order compensation or first and second order compensation both in accordance with the prior art. The Doppler or a slowly varying common mode drift signal accumulator 102 is responsive to the output voltage produced by the phase error function 24 and is gated by a gate 104 so that the error voltage produced by the phase error function 24 is applied to the Doppler or a slowly varying common mode drift signal accumulator only when burst communications are being received. The gating signal, which controls the gating produced by gate 104, is produced by burst preamble processor 105. When detection of a burst by the burst preamble processor 105 does not occur, the phase error function 24 output is not gated by gate 104 into the Doppler or slowly varying common mode draft signal accumulator to prevent the accumulation of gated error. The burst preamble processor 105 produces the gating signal by non-coherently correlating the burst preamble with the known preamble sequence and comparing the result against an inputted detection threshold. The known preamble sequence may be any code, including without limitation, a p.n. sequence, a Walsh code, etc. The burst preamble processor also provides the initial phase estimate inputted to the loop filter 26. The initial phase estimate is computed from the angle of the resultant preamble vector relative to a reference angle which may be fixed. The preamble vector is the result of the input signal correlated with the known preamble sequence in both I and Q signal space. The Doppler accumulator 102 provides a Doppler or a slowly varying common mode drift signal output 106 which provides compensation in the estimated phase angle $\theta_n$ for the Doppler or a slowly varying common mode drift signal shift produced by relative motion between the demodulator and a source of burst communications which provided the input demodulated signal as indicated in FIG. 1 or a slowly varying common drift phenomenon. Doppler or a slowly varying common mode drift signal register 108 may store a priori knowledge of a Doppler or a slowly varying common mode drift signal slew rate greater than the loop tracking rate produced by the Doppler or a slowly varying common mode drift signal accumulator 102 which may be substituted for the compensation produced by the output from the Doppler or a slowly varying common mode drift signal accumulator. Such switching from the output from Doppler or a slowly varying common mode drift signal accumulator 102 to the output from Doppler or a slowly varying common mode drift signal register 108 may be controlled by ground control software where the receiver 100 is located in the satellite. The Doppler or a slowly varying common mode drift signal accumulator 102 produces an output signal 109 which is a Doppler or a slowly varying common mode drift signal telemetry signal which indicates the degree of Doppler or a slowly varying common mode drift signal shift and which may be used in resetting part of the initial conditions of the loop filter as explained below in conjunction with FIG. 1 Adder 110 is used to provide any combined output from the Doppler or a slowly varying common mode drift signal accumulator 102 and the Doppler or a slowly varying common mode drift signal register 108 to produce a Doppler or a slowly varying common mode drift signal angular compensation $\omega_d$ which is applied to the loop filter 26.

Figure 3:
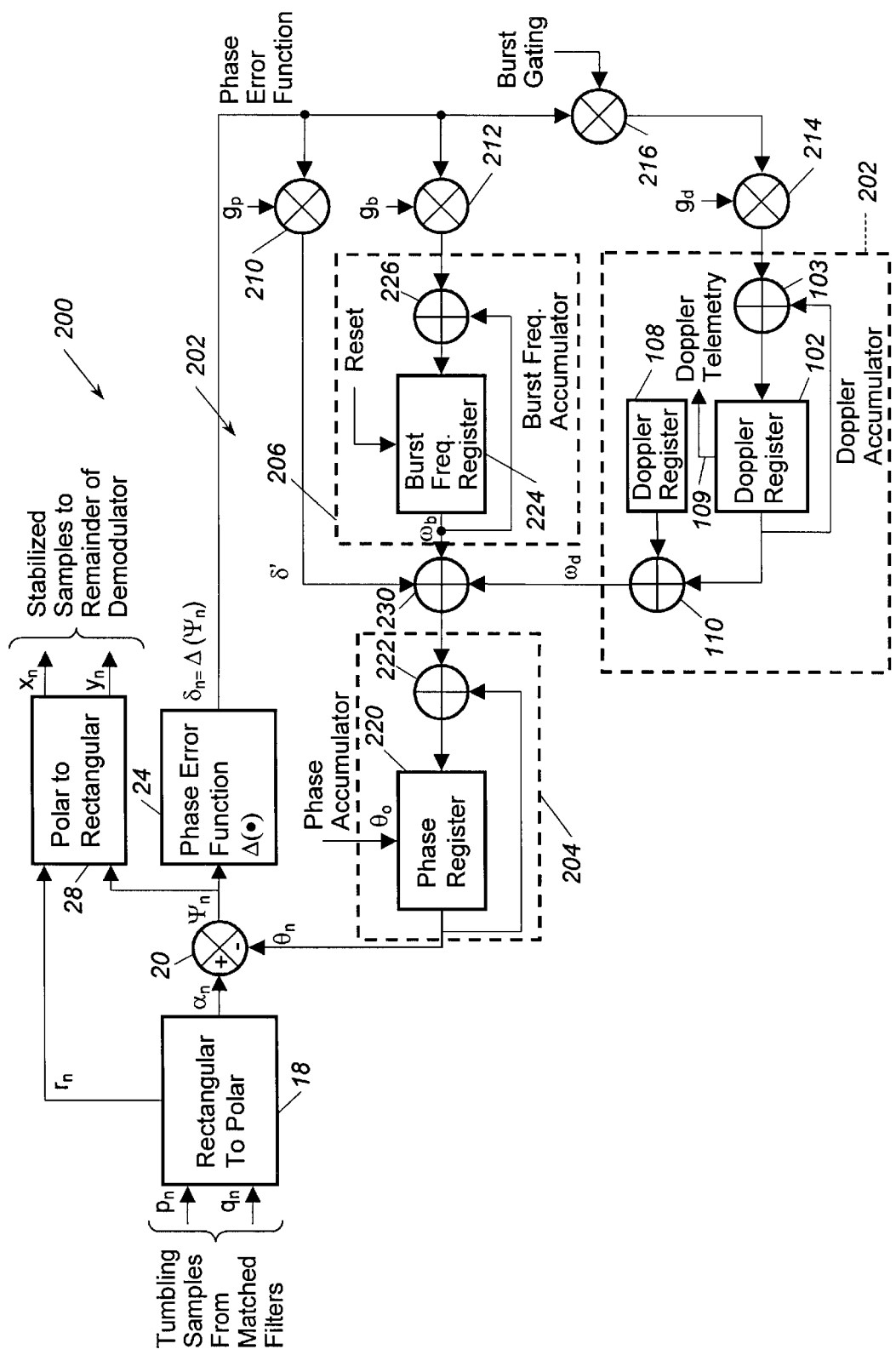
FIG. 3 illustrates a preferred embodiment of a demodulator in accordance with the present invention.

FIG. 3 illustrates a second embodiment 200 of the present invention with a phase lock loop 202 which contains a conventional phase accumulator 204, an optional burst frequency accumulator 206 and a Doppler a slowly varying common mode drift signal accumulator 208 in accordance with the present invention. The phase error function $\delta_n$ is applied respectively to the phase accumulator 204, burst frequency accumulator 206 and Doppler or a slowly varying common mode drift signal accumulator 208 with respective different gains $g_p$ produced by amplifier 210, $g_b$ produced by amplifier 212 and $g_d$ produced by amplifier 214. The relative gain of the phase error function applied to the phase accumulator 204, burst frequency accumulator 206 and Doppler or a slowly varying common mode drift signal accumulator 208 is such that the relative magnitude applied to the phase accumulator is larger than the relative magnitude applied to the burst frequency accumulator with the magnitude being in a preferred embodiment at least ten times greater and with the relative magnitude as applied to the phase accumulator 204 in comparison to the relative magnitude applied to the Doppler or a slowly varying common mode drift signal accumulator 208 being at least one thousand times greater. A combination of gating produced by gate 216, which is keyed to the presence of individual communication bursts and a relatively low gain applied by amplifier 214, facilitates the acquiring of a frequency stored in the Doppler or a slowly varying common mode drift signal accumulator 208 representing the mean Doppler or a slowly varying common mode drift signal frequency offset between the source of the input modulated signal as illustrated in FIG. 1 and the demodulator. Once the Doppler or a slowly varying common mode drift signal accumulator 208 has acquired over a period of time the mean Doppler or a slowly varying common mode drift signal shift, the result stored in the Doppler or a slowly varying common mode drift signal register 102 is substantially constant which is driven by adder 103. The phase accumulator 204 contains a conventional phase register 220 and an adder 222 which drives the phase register and the burst frequency accumulator contains a conventional burst frequency register 224 and an adder 226 which drives the burst frequency register. Adder 230 sums the outputs from the parallel connected burst frequency accumulator 206 and Doppler or a slowly varying common mode drift signal accumulator 208 to produce an input voltage to the phase accumulator 204.

A typical value for $g_d$ produced by amplifier 214 is much smaller than gain $g_b$ produced by amplifier 212 with an example being 1/16th with $g_b$ equally 1/4096 and $g_d$ being 1/65536 or smaller.

In operation, the Doppler or a slowly varying common mode drift signal accumulator 208 functions as follows. At the beginning of each received burst communication, the sequence $\delta_n$ that is produced by the phase error function 24 reflects a rotation of the incoming phase due to (1) any random effect of the settling of the uplinked frequency for the current burst and (2) any common mode or bias effect due to a difference in the true Doppler frequency a slowly varying common mode drift signal and the estimated phase thereof produced by the Doppler or a slowly varying common mode drift signal accumulator 208. If the PLL or DD-PLL is first order, (i.e. no burst frequency accumulator), then the full frequency difference is seen by the Doppler or a slowly varying common mode drift signal accumulator 208 for the duration of the burst. The Doppler or a slowly varying common mode drift signal register 102 then is stimulated by the apparent frequency difference from burst to burst. Because of the relatively low gain $g_d$, however, the impact of any one burst's frequency offset is small. Nevertheless, the cumulative effect of many such bursts causes the Doppler or a slowly varying common mode drift signal accumulator 208 to drive towards the mean frequency offset of the ensemble of such bursts. The Doppler or a slowly varying common mode drift signal accumulator 208 output $\omega_d$ has a numeric form of revolutions of phase change per symbol epoch.

When the PLL or DD-PLL is second order, the behavior of the Doppler or a slowly varying common mode drift signal accumulator 208 is similar but is influenced by an action of the burst frequency register 224 which tends to quickly acquire any frequency difference of each individual burst. Regardless, any biased frequency error produces a small impact on the Doppler or a slowly varying common mode drift signal accumulator 208 which in times slews to the bias value and automatically compensates for the Doppler effect in the PLL or DD-PLL. Thus, the PLL or DD-PLL is a slow but good acquirer of the mean Doppler shift.

The Doppler or a slowly varying common mode drift signal telemetry point 109 produced by the Doppler or a slowly varying common mode drift signal register 102 provides an accurate estimate of the Doppler or a slowly varying common mode drift signal shift which may be used as part of an algorithm for determining satellite ephemeris and to provide locally generated correction to refine an initial phase input $\omega_0$ for the phase register 220 which improves the initial phase estimate significantly to increase the probability that the PLL or DD-PLL will successfully acquire and track an incoming first phase and frequency period.

The present invention has numerous advantages. The invention obviates a need to determine satellite kinematics and eliminates a need for open loop Doppler or a slowly varying common mode drift signal compensation in the satellite, other receiver or at terminals. The invention does not require traffic control to be sent to the satellite. The invention provides automatic parallax compensation in a multibeam satellite. The invention automatically provides correction when different frequency bands are used in an uplink. The invention retains bias from burst to burst. The invention is not responsive to channel slots which do not contain traffic bursts. Although Doppler compensation is a preferred application of the invention, the invention applies equally well as explained above to any slowly varying common-mode source of frequency error. Without limitation, an example of this may be a slowly varying frequency drift in the oscillator at the satellite payload or in the cellular base station. Finally, the invention integrates easily into a prior art PLL or DD-PLL architecture.

While the invention has been described in terms of its preferred embodiments, it should be understood that numerous modifications may be made thereto without departing from the spirit and scope of the present invention. It is intended that all such modifications fall with in the scope of the appended claims.

What is claimed is:

1. A demodulator which demodulates burst communications comprising:
   a phase angle source, coupled to a current received burst communication, which provides a phase angle of the current received burst communication;
   a comparator, coupled to the phase angle source and a source of an estimated phase angle, which provides an output signal representing an angular difference between a phase of the current received burst communication and the estimated phase angle; and
   a phase lock loop, coupled to the output signal, which provides the estimated phase angle including a phase accumulator which provides a first order component of compensation in the estimated phase angle; and wherein
   the phase lock loop includes a Doppler accumulator which provides a Doppler output which provides compensation in the estimated phase angle for the Doppler effect produced by relative motion between the demodulator and a source of the burst communications; and
   the Doppler accumulator provides a second order component of compensation in the estimated phase angle.

2. A demodulator in accordance with claim 1 wherein:
   the Doppler accumulator continuously accumulates Doppler variations caused by the relative motion and provides compensation in the estimated phase angle which is not reset upon reception of each received burst communication.

3. A demodulator in accordance with claim 1 wherein:
   the demodulator is a hub in a communication system.

4. A demodulator in accordance with claim 1 wherein:
   the demodulator is in a base station of a digital cellular radio system.

5. A demodulator in accordance with claim 1 wherein:

the demodulator is in a satellite.

6. A demodulator which demodulates burst communications comprising:

a phase angle source, coupled to a current received burst communication, which provides a phase angle of the current received burst communication;

a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle including a phase accumulator which provides a first order component of compensation in the estimated phase angle and a burst frequency accumulator which provides a second order component of compensation in the estimated phase angle; and wherein the phase lock loop includes a Doppler accumulator which provides a Doppler output which provides another second order component of compensation in the estimated phase angle for the Doppler effect produced by relative motion between the demodulator and a source of the burst communications.

7. A demodulator in accordance with claim 6 wherein:

the Doppler accumulator and the burst frequency accumulator are in parallel; and outputs thereof are inputted to the phase accumulator.

8. A demodulator in accordance with claim 7 wherein:

the burst frequency accumulator is reset in response to each received burst communication.

9. A demodulator in accordance with claim 8 wherein:

the Doppler accumulator continuously accumulates Doppler variations caused by the relative motion and provides compensation in the estimated phase angle which is not reset upon reception of each received burst communication.

10. A demodulator in accordance with claim 9 wherein:

the Doppler accumulator and the burst accumulator are each responsive to an input signal which is a function of the output signal with a ratio of a magnitude of the input signal to the burst accumulator to a magnitude of the input signal to the Doppler accumulator being at least 10.

11. A demodulator in accordance with claim 10 wherein:

the phase accumulator is also responsive to an input signal which is a function of the output signal with a ratio of a magnitude of the input signal to the phase accumulator to a magnitude of the input signal to the Doppler accumulator being at least 1000.

12. A demodulator in accordance with claim 8 wherein:

the Doppler accumulator and the burst accumulator are each responsive to an input signal which is a function of the output signal with a ratio of a magnitude of the input signal to the burst accumulator to a magnitude of the input signal to the Doppler accumulator being at least 10.

13. A demodulator in accordance with claim 12 wherein:

the phase accumulator is also responsive to an input signal which is a function of the output signal with a ratio of a magnitude of the input signal to the phase accumulator to a magnitude of the input signal to the Doppler accumulator being at least 1000.

14. A demodulator in accordance with claim 7 wherein;

the Doppler accumulator continuously accumulates Doppler variations caused by the relative motion and provides compensation in the estimated phase angle which is not reset upon reception of each received burst communication.

15. A demodulator in accordance with claim 14 wherein:

the Doppler accumulator and the burst accumulator are each responsive to an input signal which is a function of the output signal with a ratio of a magnitude of the input signal to the burst accumulator to a magnitude of the input signal to the Doppler accumulator being at least 10.

16. A demodulator in accordance with claim 15 wherein:

the phase accumulator is also responsive to an input signal which is a function of the output signal with a ratio of a magnitude of the input signal to the phase accumulator to a magnitude of the input signal to the Doppler accumulator being at least 1000.

17. A demodulator in accordance with claim 7 wherein:

the Doppler accumulator and the burst accumulator are each responsive to an input signal which is a function of the output signal with a ratio of a magnitude of the input signal to the burst accumulator to a magnitude of the input signal to the Doppler accumulator being at least 10.

18. A demodulator in accordance with claim 17 wherein:

the phase accumulator is also responsive to an input signal which is a function of the output signal with a ratio of a magnitude of the input signal to the phase accumulator to a magnitude of the input signal to the Doppler accumulator being at least 1000.

19. A demodulator in accordance with claim 7 wherein:

the Doppler accumulator comprises a telemetry output which signals a Doppler shift between the demodulator and the source of burst communications.

20. A demodulator in accordance with claim 19 comprising:

a burst preamble processor which provides an initial frequency estimate to the burst frequency accumulator; and wherein the Doppler output is applied to the burst frequency accumulator as part of the initial frequency estimate of the burst frequency accumulator to correct the initial frequency estimate for Doppler shift.

21. A demodulator in accordance with claim 6 wherein:

the burst frequency accumulator is reset in response to each received burst communication.

22. A demodulator in accordance with claim 21 wherein:

the Doppler accumulator continuously accumulates Doppler variations caused by the relative motion and provides compensation in the estimated phase angle which is not reset upon reception of each received burst communication.

23. A demodulator in accordance with claim 6 wherein:

the Doppler accumulator continuously accumulates Doppler variations caused by the relative motion and provides compensation in the estimated phase angle which is not reset upon reception of each received burst communication.

24. A demodulator in accordance with claim 6 wherein:

the Doppler accumulator comprises a telemetry output which signals a Doppler shift between the demodulator and the source of burst communications.

25. A demodulator in accordance with claim 24 comprising:

a burst preamble processor which provides an initial frequency estimate to the burst frequency accumulator; and wherein the Doppler output is applied to the burst frequency accumulator as part of the initial frequency estimate of the burst frequency accumulator to correct the initial frequency estimate for Doppler shift.

26. A demodulator which demodulates burst communications comprising:

a phase angle source, coupled to a current received burst communication, which provides a phase angle of the current received burst communication;

a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle;

wherein the phase lock loop includes a Doppler accumulator which provides a Doppler output which provides compensation in the estimated phase angle for the Doppler effect produced by relative motion between the demodulator and a source of the burst communications;

and wherein the Doppler accumulator continuously accumulates Doppler variations caused by the relative motion and provides compensation in the estimated phase angle which is not reset upon reception of each received burst communication.

27. A demodulator which demodulates burst communications comprising:

a phase angle source, coupled to a current received burst communication, which provides a phase angle of the current received burst communication;

a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle;

wherein the phase lock loop includes a Doppler accumulator which provides a Doppler output which provides compensation in the estimated phase angle for the Doppler effect produced by relative motion between the demodulator and a source of the burst communications;

and wherein the demodulator further comprises a storage register contained in the Doppler accumulator which, upon command, applies a known Doppler value as compensation in the estimated phase angle while disabling the Doppler output from providing compensation.

28. A demodulator which demodulates burst communications comprising:

a phase angle source, coupled to a current received burst communication, which provides a phase angle of the current received burst communication;

a comparator, coupled to the phase angle source and a source of an estimated phase angle, which provides an output signal representing an angular difference between a phase of the current received burst communication and the estimated phase angle; and a phase lock loop, coupled to the output signal, which provides the estimated phase angle;

wherein the phase lock loop includes a Doppler accumulator which provides a Doppler output which provides compensation in the estimated phase angle for the Doppler effect produced by relative motion between the demodulator and a source of the burst communications;

and wherein the demodulator further comprises a burst preamble processor, which is responsive to a burst input, to produce a gating signal; and a gate, coupled to the comparator and the Doppler accumulator, which passes a signal which is a function of the output signal from the comparator to the Doppler accumulator.

29. In a demodulator which demodulates burst communications including a phase angle source, a comparator coupled to the phase angle source and a source of an estimated phase angle and a phase lock loop, a method of receiving burst communications comprising:

providing a phase angle from a phase angle source of a current received burst communication:

providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications; and the phase lock loop comprises a phase accumulator which provides a first order component of compensation in the estimated phase angle and the Doppler accumulator provides a second order component of compensation in the estimated phase angle.

30. A method in accordance with claim 29 wherein:

the Doppler accumulator continuously accumulates Doppler variations and provides compensation in the estimated phase angle which is not reset upon reception of each received burst communication.

31. In a demodulator which demodulates burst communications including a phase angle source, a comparator coupled to the phase angle source and a source of an estimated phase angle and a phase lock loop, a method of receiving burst communications comprising:

providing a phase angle from the phase angle source of a current received burst communication;

providing from the comparator an output signal representing an angular difference between a phase of the current received burst communication and the estimated phase angle; and providing the estimated phase angle from the phase lock loop including a Doppler output which provides compensation in the estimated phase angle for the Doppler effect produced by relative motion between the demodulator and a source of the burst communications; wherein the phase lock loop comprises a phase accumulator which provides a first order component of compensation in the estimated phase angle and the Doppler accumulator provides a second order component of compensation in the estimated phase angle; and a burst frequency accumulator provides another second order compensation in the estimated phase angle.

32. A method in accordance with claim 31 wherein:

the Doppler accumulator and the burst frequency accumulator are in parallel with outputs thereof being inputted into the phase accumulator.

33. A method in accordance with claim 32 wherein:
the burst frequency accumulator is reset in response to each received burst communication.

34. A method in accordance with claim 33 wherein:
the Doppler accumulator continuously accumulates Doppler variations and provides compensation in the estimated phase angle which is not reset upon reception of each received burst communication.

35. A method in accordance with claim 33 wherein:
the Doppler accumulator and the burst accumulator are each responsive to an input signal which is a function of the output signal with a ratio of a magnitude of the input signal to the burst accumulator to a magnitude of the input signal to the Doppler accumulator being at least 10.

36. A method in accordance with claim 35 wherein:
the phase accumulator is also responsive to an input signal which is a function of the output signal with a ratio of a magnitude of the input signal to the phase accumulator to a magnitude of the input signal to the Doppler accumulator being at least 1000.

37. A method in accordance with claim 32 wherein:
the Doppler accumulator continuously accumulates Doppler variations and provides compensation in the estimated phase angle which is not reset upon reception of each received burst communication.

38. A method in accordance with claim 32 wherein:
the Doppler accumulator comprises a telemetry output which signals a Doppler shift between the demodulator and the source of burst communications.

39. A method in accordance with claim 38 wherein:
a burst preamble processor provides an initial frequency estimate to the burst frequency accumulator; and wherein
the Doppler output is applied to the burst frequency accumulator as part of the initial frequency estimate of the burst frequency accumulator to correct the initial frequency estimate for Doppler shift.

40. A method in accordance with claim 31 wherein:
the burst frequency accumulator is reset in response to each received burst communication.

41. A method in accordance with claim 40 wherein:
the Doppler accumulator continuously accumulates Doppler variations and provides compensation in the estimated phase angle which is not reset upon reception of each received burst communication.

42. A method in accordance with claim 40 wherein:
the Doppler accumulator and the burst accumulator are each responsive to an input signal which is a function of the output signal with a ratio of a magnitude of the input signal to the burst accumulator to a magnitude of the input signal to the Doppler accumulator being at least 10.

43. A method in accordance with claim 42 wherein:
the phase accumulator is also responsive to an input signal which is a function of the output signal with a ratio of a magnitude of the input signal to the phase accumulator to a magnitude of the input signal to the Doppler accumulator being at least 1000.

44. A method in accordance with claim 31 wherein:
the Doppler accumulator continuously accumulates Doppler variations and provides compensation in the estimated phase angle which is not reset upon reception of each received burst communication.

45. A method in accordance with claim 31 wherein:
the Doppler accumulator comprises a telemetry output which signals a Doppler shift between the demodulator and the source of burst communications.

46. A method in accordance with claim 45 wherein:
a burst preamble processor provides an initial frequency estimate to the burst frequency accumulator; and wherein
the Doppler output is applied to the burst frequency accumulator as part of the initial frequency estimate of the burst frequency accumulator to correct the initial frequency estimate for Doppler shift.

47. In a demodulator which demodulates burst communications including a phase angle source, a comparator coupled to the phase angle source and a source of an estimated phase angle and a phase lock loop, a method of receiving burst communications comprising:
providing a phase angle from the phase angle source of a current received burst communication;
providing from the comparator an output signal representing an angular difference between a phase of the current received burst communication and the estimated phase angle; and
providing the estimated phase angle from the phase lock loop including a Doppler output which provides compensation in the estimated phase angle for the Doppler effect produced by relative motion between the demodulator and a source of the burst communications;
and wherein the Doppler accumulator continuously accumulates Doppler variations and provides compensation in the estimated phase angle which is not reset upon reception of each received burst communication.

48. In a demodulator which demodulates burst communications including a phase angle source, a comparator coupled to the phase angle source and a source of an estimated phase angle and a phase lock loop, a method of receiving burst communications comprising:
providing a phase angle from the phase angle source of a current received burst communication;
providing from the comparator an output signal representing an angular difference between a phase of the current received burst communication and the estimated phase angle; and
providing the estimated phase angle from the phase lock loop including a Doppler output which provides compensation in the estimated phase angle for the Doppler effect produced by relative motion between the demodulator and a source of the burst communications;
and wherein a storage register contained in the Doppler accumulator which, upon command, applies a known Doppler value as compensation in the estimated phase angle while disabling the Doppler output from providing compensation.

49. A demodulator which demodulates burst communications comprising:
a phase angle source, coupled to a current received burst communication, which provides a phase angle of the current received burst communication;
a comparator, coupled to the phase angle source and a source of an estimated phase angle, which provides an output signal representing an angular difference between a phase of the current received burst communication and the estimated phase angle; and
a phase lock loop, coupled to the output signal, which provides the estimated phase angle including a phase accumulator which provides a first order component of compensation in the estimated phase angle; and wherein the phase lock loop includes a slowly varying common mode drift signal accumulator which provides a slowly varying common mode drift signal output which provides compensation in the estimated phase angle for an effect of the slowly varying common mode drift signal; and the slowly varying common mode drift signal accumulator provides a second order component of compensation in the estimated phase angle.

50. A demodulator which demodulates burst communications comprising:

a phase angle source, coupled to a current received burst communication, which provides a phase angle of the current received burst communication;

a comparator, coupled to the phase angle source and a source of an estimated phase angle, including a phase accumulator which provides a first order component of compensation in the estimated phase angle; and a phase lock loop, coupled to the output signal, which provides the estimated phase angle including a phase accumulator which provides a first order component of compensation in the estimated phase angle and a burst frequency accumulator which provides a second order component of compensation in the estimated phase angle; and wherein the phase lock loop includes a slowly varying common mode drift signal accumulator which provides a slowly varying common mode drift signal output which provides another second order compensation of compensation in the estimated phase angle for an effect of the slowly varying common mode drift signal.

51. In a demodulator which demodulates burst communications including a phase angle source, a comparator coupled to the phase angle source and a source of an estimated phase angle and a phase lock loop, a method of receiving burst communications comprising:

providing a phase angle from a phase angle source of a current received burst communication;

providing from the comparator an output signal representing an angular difference between a phase of the current received burst communication and the estimated phase angle; and providing the estimated phase angle from the phase lock loop including a slowly varying common mode drift signal output which provides compensation in the estimated phase angle for an effect of the slowly varying common mode drift signal; and the phase lock loop comprises a phase accumulator which provides a first order component of compensation in the estimated phase angle and a slowly varying common mode drift signal accumulator provides a second order component of compensation in the estimated phase angle.

52. In a demodulator which demodulates burst communications including a phase angle source, a comparator coupled to the phase angle source and a source of an estimated phase angle and a phase lock loop, a method of receiving burst communications comprising:

providing a phase angle from the phase angle source of a current received burst communication;

providing from the comparator an output signal representing an angular difference between a phase of the current received burst communication and the estimated phase angle; and providing the estimated phase angle from the phase lock loop including a slowly varying common mode drift signal output which provides compensation in the estimated phase angle for an effect of the slowly varying common mode drift signal; wherein the phase lock loop comprises a phase accumulator which provides a first order component of compensation in the estimated phase angle and a slowly varying common mode drift signal accumulator provides a second order component of compensation in the estimated phase angle; and a burst frequency accumulator provides another second order compensation in the estimated phase angle.

* * * * *